United States Patent [19]

Payne et al.

[11] Patent Number: 4,506,765
[45] Date of Patent: Mar. 26, 1985

[54] PROXIMITY DETECTOR CIRCUITRY ESPECIALLY FOR LIFT DOORS

[76] Inventors: Reginald K. Payne, Stud Green Farm, Holyport, Maidenhead, Berkshire; John Trett, Ranch House, Frieth, Henley-on-Thames, Oxfordshire, both of England

[21] Appl. No.: 420,246

[22] PCT Filed: Jan. 26, 1982

[86] PCT No.: PCT/GB82/00022
§ 371 Date: Sep. 16, 1982
§ 102(e) Date: Sep. 16, 1982

[87] PCT Pub. No.: WO82/02536
PCT Pub. Date: Aug. 5, 1982

[30] Foreign Application Priority Data
Jan. 26, 1981 [GB] United Kingdom ................. 8102324

[51] Int. Cl.³ ............................................. B66B 13/26
[52] U.S. Cl. .................................... 187/29 R; 187/48; 340/19 R; 318/467
[58] Field of Search ............... 318/284, 256, 466, 467; 307/351–362, 510–530, 116; 340/19, 552, 555–561; 367/199, 97; 187/29 R, 29, 48

[56] References Cited
U.S. PATENT DOCUMENTS

| 3,018,851 | 1/1962 | Diamond et al. ..................... 187/48 |
| 3,370,677 | 2/1968 | Federmann et al. .................. 187/48 |
| 3,743,058 | 7/1973 | Diamond .......................... 187/29 R |
| 3,972,021 | 7/1976 | Leitz et al. .................... 340/19 R X |
| 4,016,490 | 4/1977 | Weckenmann et al. ........ 361/181 X |
| 4,191,894 | 3/1980 | Noda et al. ........................ 307/116 |
| 4,208,695 | 6/1980 | Noda et al. .................... 307/116 X |
| 4,261,440 | 4/1981 | Jacoby .............................. 187/48 |
| 4,322,631 | 3/1982 | Spofford ....................... 307/116 X |
| 4,364,003 | 12/1982 | Phipps ............................. 318/466 X |

Primary Examiner—J. V. Truhe
Assistant Examiner—Paul Shik Luen Ip
Attorney, Agent, or Firm—Darby & Darby

[57] ABSTRACT

Proximity detector circuitry of particular value in controlling the operation of elevator car doors. Sensors are set in the edge of the door. The outputs of the sensors are fed to one or more differential amplifiers which produce outputs dependent on the sensors. One such output may be compared in a further differential amplifier with its previous output slightly delayed in time and the results of the comparison used to actuate a door closing/opening control circuit. In addition large outputs arising from major differences in the sensors output may be fed (suitably attenuated) to the closing/opening control circuit.

9 Claims, 1 Drawing Figure

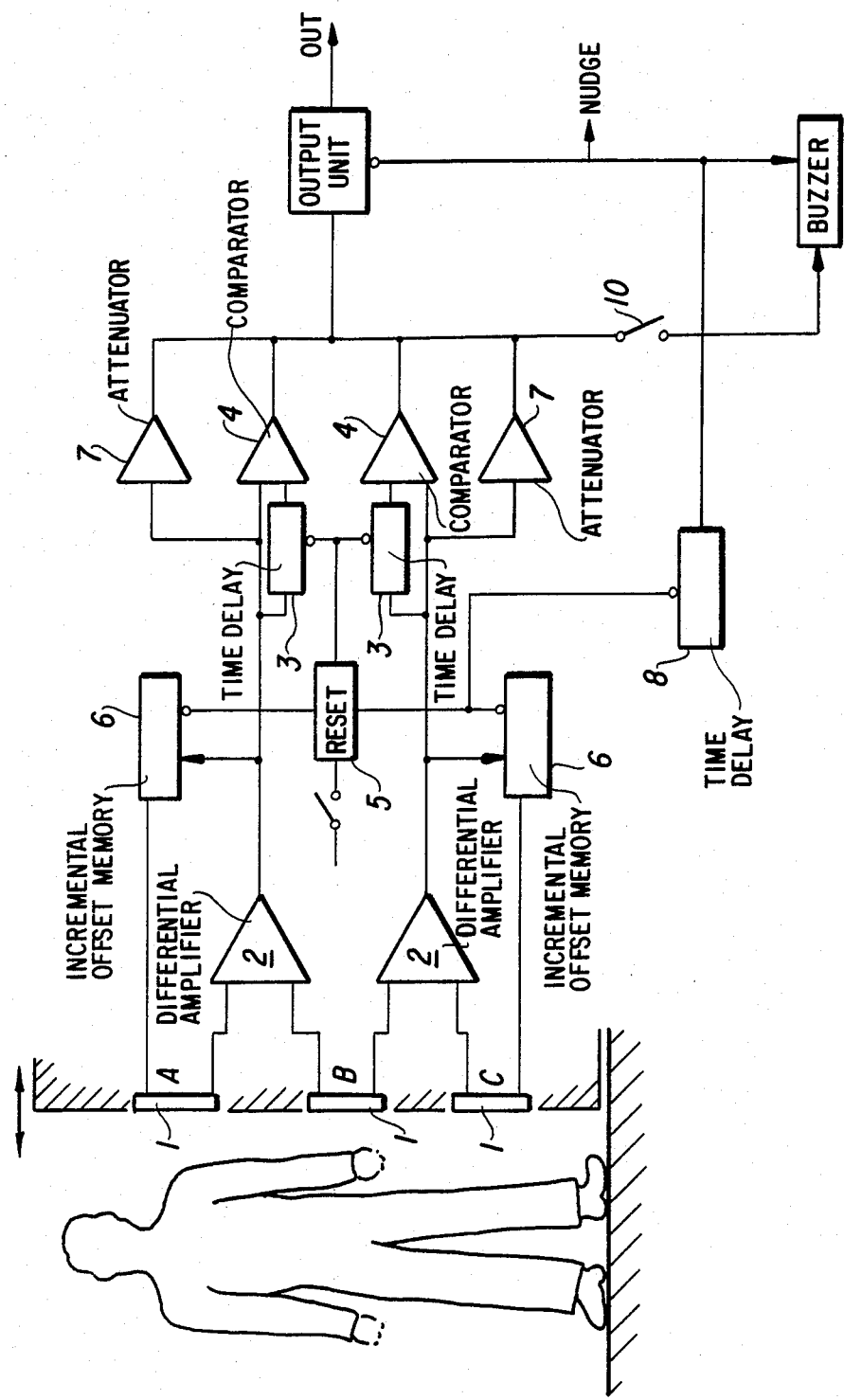

PROXIMITY DETECTOR CIRCUITRY ESPECIALLY FOR LIFT DOORS

This invention relates to proximity detector circuitry particularly though not exclusively for use in connection with lift or elevator closure doors.

It is common practice in the construction of elevator installations to include means for ensuring that the doors cannot close on a person causing discomfort or injury. A number of contactless systems are known for detecting the presence of a person in a doorway, particularly the presence of a person in the space which the door is approaching. British Patent Specification Nos. 711,515, 856,085 and 1,108,884 describe systems of this nature. Specification 1,108,884 describes and claims a proximity detector circuit for elevator doors in which the circuit is responsive the variation in the capacitance to ground of antennae which are mounted at the edge of the closing door. The change in capacitance is determined using bridge circuits and appropriate voltage supply and amplifying means and suitable circuitry is provided to ensure that if the closing door detects the presence of a person or other object in the way, then the door is stopped or retracted and of course the elevator car prevented from moving until the door has closed properly.

As described in Specification No. 1,108,884, and particularly as shown in the left-hand side of the drawing, antennae are positioned in pairs along the leading vertical edge of the elevator car door. Each pair of antennae are used in a bridge type circuit with imbalances being detected rather than a mere change in capacity. This prevents false detections arising because of a change in the capacity between antennae to ground as the door itself moves. Thus, fixed items parallel to the detector such as the slam post against which the door eventually lodges or the metal work of the lift car door return adjacent the door edge when the door is fully open, do not affect the balance of the bridge circuit and are accordingly not detected as, would for example, people or other objects in the doorway which are not parallel to the door.

While this approach works satisfactorily in many instances, it is not always reliable in practice and it tends to be somewhat oversensitive. For example, if the slam post against which the door leading edge comes to lodge is not parallel to that leading edge as it approaches it, an imbalance may occur tripping the door retraction circuitry. A similar problem may arise with other parts of the car if they are not parallel to the door edge. Similarly, problems may arise with structural steel work such as landing doors adjacent to which the lift car may be brought to rest at an appropriate floor, and misalignments may vary from floor to floor. In the case of lift systems where the lift car and landings are each provided with sliding doors each running in tracks mounted in the car body and on the structure of the building respectively, if those tracks are not parallel, imbalance may arise. Other causes of imbalance can occur during use because of roller or guide wear on the door, particularly if it is sufficient to wobble the door as it is being moved. Even changes in temperature and humidity or moisture or dirt coming on to the lift components can cause the circuitry to go out of balance and generate or aggravate false detection problems.

According to a first feature of the present invention there is provided proximity detector circuitry for use in connection with a door closure or analogous apparatus which comprises three sensors located at spaced intervals along the edge of the door, the outputs of the three sensors being fed to two differential amplifiers each of which compares the outputs of two of the sensors, each producing an error signal if there is a difference in output from the two sensors connected thereto, and means for generating appropriate door control signals on the detection of an error signal.

By using three sensors connected to two differential amplifiers, problems associated with balanced bridge type systems and particularly with eliminating a null are provided.

According to a second feature of the invention there is provided proximity detector circuitry for use in connection with a lift door or in a like situation which comprises a pair of sensors mounted in the leading edge of the door or like member, a differential amplifier having two imputs one connected to the output of each sensor, the amplifier being arranged to generate an error signal in the case of an imbalance between the two sensors, means for delaying the error signal to produce a delayed error signal, means for comparing the later occurring actual error signal with the delayed error signal and means for generating a control signal as a result of that comparison.

The use of a delayed error signal leads to substantial advantages. The delay should be related to the system under consideration and, for example, for elevator lift doors may be about one half second with a door moving at a 15 cms per second. If someone approaches the door, particularly if they are moving, the change in signal from the sensor takes place in substantially less than one half second so the error signal and delayed error signal will differ substantially and this difference can be used to trigger appropriate control circuitry to, for example, cause the lift door to retract.

The advantage of this system is that slow changes, for example, due to door misalignment, wear, or differences between the relative positions of the elevator car doors and the lift shaft doors between floors and similar problems noted above, are all sufficiently slow not to generate such control signals.

An important point in the design of a proximity detector using antennae is that the field pattern should be asymmetrically arranged so that the field pattern of sensitivity does not "see" inside the car (where door retraction could be triggered by a person standing just inside the car) but should be capable of detecting outside the car doors up to and including in front of the landing doors. This has been achieved in previous designs by "guarding" the antennae of the detector in an asymmetrical metal channel so deflecting the field pattern towards the landing door. This has the disadvantage that the detectors become "handed" necessitating a doubling of the inventory to cope with right-handed and left-handed door openings. A further feature of the invention is in the use of symmetrical guard channels in which the field pattern is symmetrical but alongside which a metal shim is inserted on site to produce right- or left-handed edge detectors as required, with a subsequent halving of the inventory which the lift manufacturer needs to maintain.

In practical installations it is, of course, desirable to use all the features of the invention as noted above. By way of further explanation and illustration of the invention, there will now be described a specific application of the invention to the control of elevator car doors.

The explanation which follows makes reference to the accompanying drawing which shows in diagrammatic form a circuit and mechanical arrangement according to the invention. The diagram is a block diagram and of course the individual circuit units may be realised using any appropriate electronic circuit means. Conveniently the circuitry is constructed using standard integrated circuitrs on a suitable printed circuit board. The necessary additional circuitry to ensure optimum operation, for example a stabilised power supply and means for correcting for temperature changes and the like may of course be incorporated in the circuitry without difficulty using known techniques.

Referring to the drawing, there is shown on the left-hand side three sensors which are arranged down the leading edge of a lfit door. These are antennae for capacitance measurement in the embodiment illustrated but of course the invention can operate with other sensors, for example photocell arrangements or ultrasonic transmitter receiver arrangements.

Outputs from the sensors are fed to a pair of differential amplifiers 2, one comparing the signal from sensor A with the signal from sensor B and the other comparing the signal from sensor B with the signal from sensor C. Each differential amplifier produces an error signal if there is any difference in the signals received from the two sensors connected to it. Because of the use of three sensors and two amplifiers there is no null between the sensors so that undulations in an object adjacent the edge of the door, for example, a human body, are detected anywhere down the edge of the door.

The error signals from the differential amplifiers 2 are each fed to a dynamic time delay unit 3. For a door closing at a speed of e.g. 15 cms per second the time constant for such dynamic delay units 3 may be chosen to be e.g. ½ second. The outputs of each of the dynamic time delay units is fed to a comparator 4, to which is also fed the error signal directly from the differential amplifier 2. If the two signals differ by more than a threshold amount, then the comparator generates an output signal which may be fed via suitable controls to electromechanical means which interrupt door closing.

We have found it useful to remove this dynamic time delay and reset the error signals to be the same at certain points when the door is operating. This arises because, with the doors closed and the car travelling up the shaft, gross out of balance signals can be produced by the iron work of the lift shaft and this can cause problems if the dynamic time delay does not have sufficient time to adjust during door opening. Also balance conditions may differ from floor to floor. Accordingly it is useful to reset by means of reset circuitry 5 both dynamic time delays each time the doors are opening when the lift has reached an appropriate floor. Most conveniently the resetting operation is effected when the doors are a few centimeters open just at the beginning of opening when the doors are in their new surroundings i.e. at the appropriate floor but not yet subject to people passing through. The reset signal may be generated from a microswitch on the door or by other convenient means.

In order that the sensor signals from the sensors A, B and C do not differ so much that the error signal produced is outside the range of the differential amplifier, it is desirable to ensure that the sensor signals are substantially equivalent. This can be done by on site adjustment but such adjustment would not normally be self-compensating. Thus in the specific circuit shown in the Figure an alternative approach is adopted of producing a correction signal which is fed to each of sensors A and C. This correction signal is derived from an incremental offset memory 6 which unit is activated by means of the reset signal each time that is operated e.g. by the microswitch. The incremental offset memory is fed with the signal from the differential amplifier 2 and in turn feeds a correction back to sensor A or sensor C every time the doors open and the reset unit 5 is operated. Each time a signal is received from reset unit 5, the incremental offset memory 6 adjusts the signal from sensors A and C such that they approach the output from sensor B. Of course, the amount of each incremental step must be less than that which would give an error signal out of range so that, even if an object were obstructing the door when the reset signal was generated, which would lead to an incremental correction to the sensor in the wrong direction, the detector would still be within its operating range and a proper correction would be applied to the sensor at the next operation of the reset means 5.

In normal operation it is useful to be able to hold the doors open if someone is standing in the way of the door, even if they are standing stationary. If they are standing stationary for a period longer than the delay time of dynamic time delay unit 3, then after the appropriate time delay the output signal from comparator 4 would disappear. However, any error signal produced from differential amplifier 2 in such circumstances is substantially larger than that generated by the approach of a body e.g. 20 to 30 cms away and very much larger if the body or person is holding or touching the lift door. In such circumstances the door is maintained open by feeding an error signal attenuated by means of an attenuator 7 to the output unit as before. The presence of the attenuated signal does not adversely affect the operation of the circuitry as described above during normal dynamic operation of the circuit, as would have been the case if no attentuation were effected.

The circuit shown in the diagram has a nudging facility incorporating a time delay unit 8. This time delay unit is reset each time the doors open by means of reset unit 5. The time delay unit 8 is arranged to produce an attenuation of the output signal until a door closing signal is produced, if the door is held open for a long time or if the error signal is out of range for a long time. The doors then close under reduced sensitivity of detection and the whole circuitry is reset when they next open. At the same time as producing a door close output, a buzzer 9 is provided to warn anyone who is there that the doors are going to attempt to close. Buzzer 9 may be used usefully during setting up the circuitry shown in a lift installation, for which purpose a set-up switch 10 is provided enabling the output from comparators 4 to actuate the buzzer.

We claim:

1. Proximity detector circuitry for use in connection with door closure or analogous apparatus which comprises at least three sensors located at spaced intervals along the edge of a door, at least two of said sensors having control inputs for regulating outputs thereof, two differential amplifiers each of which is arranged to receive and compare the outputs of two of the sensors, each producing an error signal if there is a difference in output from the two sensors connected thereto, means for generating appropriate door control signals on the detection of an error signal, and means coupled to the control inputs for periodically adjusting said two sensors to approximate the outputs thereof to that of the third sensor.

2. Proximity detector circuitry according to claim 1 wherein the means for periodically adjusting includes means coupling respective ones of the error signals to the control inputs of said at least two of the sensors.

3. Proximity detector circuitry for use in connection with a lift door or in a like situation which comprises a pair of sensors mounted in the leading edge of the door or like member, a differential amplifier having two inputs one connected to the output of each sensor, the amplifier being arranged to generate an error signal in the case of an imbalance between the two sensors, means for delaying the error signal to produce a delayed error signal, means for comparing the later occurring actual error signal with the delayed error signal and means for generating a control signal as a result of that comparison.

4. Proximity detector circuitry according to claim 3 wherein the delay imparted to the delayed error signal is 0.25 to 0.75 seconds.

5. Proximity detector circuitry according to claim 3 or 4 and including reset means enabling resetting when actuated of both delay means.

6. Proximity detector circuitry according to any one of claims 1–3 or 4 wherein the sensors each include an antenna mounted adjacent the door or like edge, in an asymmetrical metal guiard channel comprising a symmetrical metal channel and a metal shim inserted in the symmetrical metal channel to one side of the antenna.

7. Proximity detector circuitry according to any one of claims 1–3 or 4 and including means for attenuating the error signal and feeding such an attenuated error signal to control circuitry arranged to control the movement of the lift door or the like.

8. Proximity detector circuitry according to any one of claims 1–3 or 4 and including a long-period time delay and means for detecting the presence of an imbalance for a time exceeding that long period delay and, in such a case, actuating the control to effect movement of the door or the like.

9. An elevator installation comprising an elevator car having one or more elevator car doors, and at least two sensors arranged in the vertical opening edge of one such door, the sensors forming part of, and the installation accordingly including, proximity detector circuitry according to any one of claims 1–3 or 4.

* * * * *